(12) United States Patent
Lee et al.

(10) Patent No.: US 7,394,696 B2
(45) Date of Patent: Jul. 1, 2008

(54) NAND TYPE NON-VOLATILE MEMORY DEVICE AND METHOD OF FORMING THE SAME

(75) Inventors: Joon-Hee Lee, Seongnam-si (KR); Su-In Baek, Seoul (KR)

(73) Assignee: Samsung Electronics Co., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/646,164

(22) Filed: Dec. 27, 2006

(65) Prior Publication Data

US 2008/0093678 A1  Apr. 24, 2008

(30) Foreign Application Priority Data

Oct. 20, 2006  (KR)  ...................... 10-2006-0102376

(51) Int. Cl.
*G11C 11/34* (2006.01)
(52) U.S. Cl. .............................. 365/185.17; 365/185.24
(58) Field of Classification Search ............ 365/185.17, 365/185.24
See application file for complete search history.

(56) References Cited

U.S. PATENT DOCUMENTS 6,850,439 B1 * 2/2005 Tanaka .................. 365/185.17

2007/0002627 A1 * 1/2007 Youn ...................... 365/185.17
2007/0297233 A1 * 12/2007 Maejima ................ 365/185.17

FOREIGN PATENT DOCUMENTS

| KR | 1999 012155   | 2/1999  |
| KR | 1999 0031469  | 5/1999  |
| KR | 11284155      | 10/1999 |
| KR | 1020030057712 | 7/2003  |
| KR | 1020050067504 | 7/2005  |
| KR | 1020050076115 | 7/2005  |
| KR | 1020060072688 | 6/2006  |

OTHER PUBLICATIONS

English Abstract for Publication No.: 1999-012155.
English Abstract for Publication No.: 1999-0031469.
English Abstract for Publication No.: 11-284155.
English Abstract for Publication No.: 1020030057712.
English Abstract for Publication No.: 1020050067504.
English Abstract for Publication No.: 1020050076115.
English Abstract for Publication No.: 1020060072688.

* cited by examiner

*Primary Examiner*—Michael T Tran
(74) *Attorney, Agent, or Firm*—F. Chau & Associates, LLC

(57) ABSTRACT

A NAND type non-volatile memory device and a method for forming the same. Well bias lines are disposed substantially parallel to other wiring lines at equal intervals. Active regions that are electrically connected to the well bias line are disposed substantially parallel to other active regions at the same equal intervals. As a result, continuity and repeatability in patterns may be maintained and pattern defects may be minimized or prevented.

20 Claims, 10 Drawing Sheets

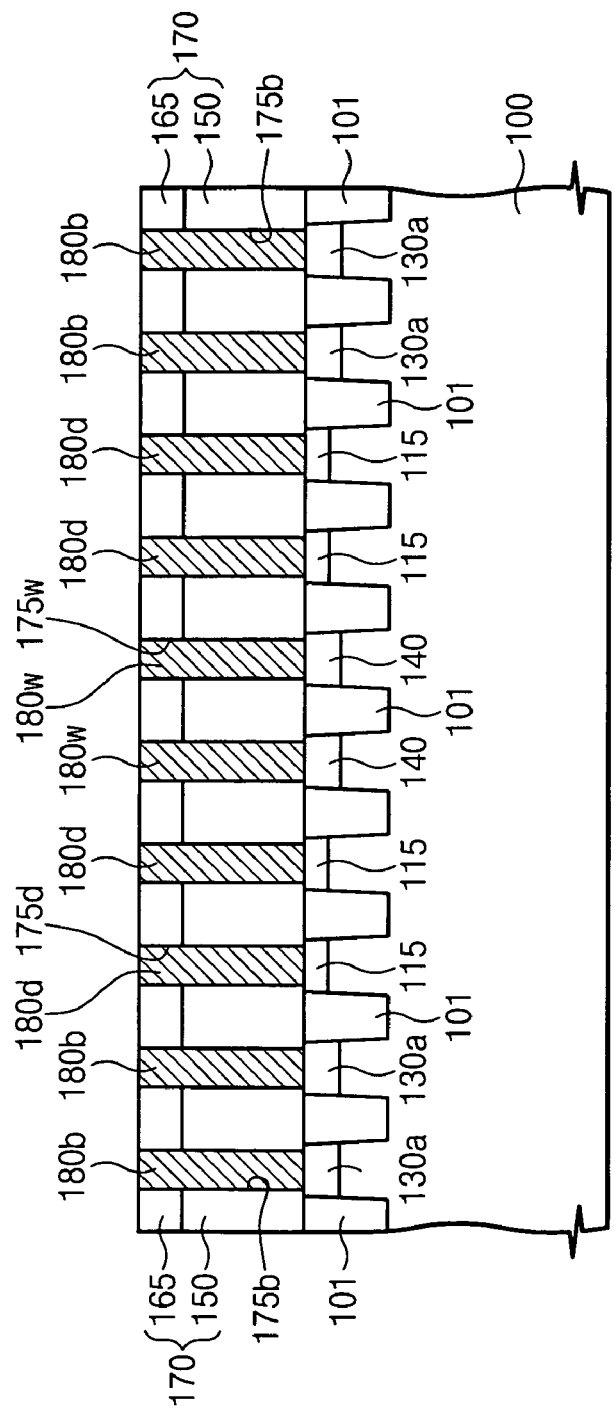

NAND TYPE NON-VOLATILE MEMORY DEVICE AND METHOD OF FORMING THE SAME

CROSS-REFERENCE TO RELATED APPLICATIONS

This application claims priority under 35 U.S.C. § 119 to Korean Patent Application No. 10-2006-0102376, filed on Oct. 20, 2006, the entire contents of which are hereby incorporated by reference.

BACKGROUND OF THE INVENTION

1. Technical Field

The present disclosure relates to a memory device, and more particularly, to a NAND type non-volatile memory device and a method for forming the same.

2. Discussion of the Related Art

Non-volatile memory devices retain stored data even when no power is supplied to it. One example of a non-volatile memory device is a flash memory device. The flash memory device writes and erases data using electric signals. The flash memory device may be classified as a NOR type flash memory device or a NAND type flash memory device. Since the NOR type flash memory device is capable of performing high speed random access, it is widely used in devices that require high speed operation. Since the NAND type flash memory device has an excellent programming and erasing speed and can be easily realized in high integration, it is widely utilized in high-capacity storage units.

The NAND type flash memory device includes a plurality of cell strings. Each cell string includes a plurality of unit cells connected in series. A string select transistor and a ground select transistor are connected to two sides of each of the unit cells, respectively. The unit cells and select transistors are formed on an active region of a semiconductor substrate. The NAND type flash memory device applies a predetermined bias into the active region. Accordingly, the NAND type flash memory device has a structure in which a bias is applied into a well.

A structure for applying a well bias is discussed in Korean Patent Publication (NO. 1999-31469). According to the structure, a region where a well contact is formed is larger than a neighboring region where a cell string is formed. Additionally, to form the well contact, a portion of gate lines may be cut. Accordingly, continuity and/or repeatability of patterns become(s) irregular due to the well contact in the semiconductor substrate. Due to the irregularity of continuity and/or repeatability in the patterns, a photolithography process becomes unstable. For example, because of a difference in an amount of scattered reflection during exposure due to the discontinuity and non-repeatability of patterns, product defects occur during a photolithography process. Accordingly, other neighboring patterns (e.g., an active region where cells are formed, gate lines and/or select gate lines in cells) where the well contacts are formed may have an irregular form. Consequently, since the distribution of the non-volatile memory cells becomes irregular, it may cause characteristic deterioration and malfunction in the NAND type non-volatile memory device. Since there is a trend towards highly-integrated semiconductor devices, the minimum line width of the device is reduced. Therefore, pattern defects due to the discontinuity and/or non-repeatability in patterns occur more frequently.

SUMMARY OF THE INVENTION

The present disclosure provides a NAND type non-volatile memory device having a well bias structure that minimize pattern defects and a method for forming the same.

Exemplary embodiments of the present invention provide NAND type non-volatile memory devices including a plurality of active regions arranged at a same interval at a substrate. The active regions extend along a first direction and are doped with a first conductive type dopant. First and second select gate lines run parallel to each other and cross over the active regions. A plurality of cell gate lines cross over the active region between the first and second select gate lines. A cell doping region is formed at the active region in both sides of the cell gate line. The cell doping region is doped with a second conductive type dopant. A plurality of contact plugs penetrate an interlayer insulation layer covering the substrate to contact the plurality of active regions respectively at one side of the first select gate line. The contact plugs are arranged at regular intervals along a second direction perpendicular to the first direction. A plurality of wiring lines are arranged at regular intervals on the interlayer insulation layer, parallel to the active regions, and connected to the plurality of contact plugs respectively. The wiring lines include bit lines and one or more adjacent well bias lines.

In some exemplary embodiments, the bit lines may be divided into a first bit line group and a second bit line group. In this case, the well bias line is disposed between the first bit line group and the second bit line group.

In other exemplary embodiments, one or more wiring lines between the well bias line and the first bit line group may be first dummy line(s), and one or more wiring lines between the well bias line and the second bit line group may be second dummy line(s). During writing, erasing, and sensing operations, the first and second dummy lines may be floated, or a voltage identical to a voltage supplied to the well bias line may be applied to the first and second dummy lines.

In still other exemplary embodiments, an interval between the bit line and the nearest well bias line may be identical to an interval between a pair of proximate wiring lines.

In other exemplary embodiments, the device may include a well bias doping region formed at the active region contacting the contact plug connected to the well bias line. The doping region is doped with the first conductive type dopant. A common drain region is formed at the active region contacting the contact plug connected to the bit line and doped with the second conductive type dopant. The well bias doping region may have a dopant concentration higher than that of the active region.

In other exemplary embodiments, the device may further include a gate spacer formed on both sidewalls of the first select gate line. The well bias doping region and the common drain region are aligned with the gate spacer.

In further exemplary embodiments, the device may further include a source line disposed in the interlayer insulation layer crossing over the active regions at one side of the second select gate line along the second direction. The source line contacts the active regions therebelow. The interlayer insulation layer may include sequentially stacked first and second insulation layers. The top surface of the source line may be coplanar with the top surface of the first insulating layer and the second insulation layer covering the source line.

In further exemplary embodiments, the cell gate line may include a control gate electrode crossing over the active region. A charge storing pattern may be interposed between the control gate electrode and the active region. A tunnel insulation layer may be interposed between the charge storing pattern and the active region. A blocking insulation pattern may be interposed between the charge storing pattern and the control gate electrode.

In other exemplary embodiments of the present invention, methods for forming a NAND type non-volatile memory device include forming a plurality of active regions arranged at a same interval on a substrate. The active regions extend along a first direction and are doped with a first conductive type dopant. First and second select gate lines run parallel to each other and cross over the active regions. A plurality of cell gate lines cross over the active region between the first and second select gate lines. A cell ion implantation process is performed with a second conductive type dopant using the cell gate lines and the first and second select gate lines as a mask. An interlayer insulation layer covering the substrate is formed. A plurality of contact plugs are formed penetrating the interlayer insulation layer to contact the plurality of active regions respectively at one side of the first select gate line. The contact plugs are arranged at regular intervals along a second direction perpendicular to the first direction. A plurality of wiring lines are formed arranged at regular intervals on the interlayer insulation layer, parallel to the active regions, and connected to the plurality of contact plugs respectively. The wiring lines include bit lines and one or more well bias lines adjacent to each other.

BRIEF DESCRIPTION OF THE DRAWINGS

The accompanying figures are included to provide a further understanding of the present disclosure, and are incorporated in and constitute a part of this specification. The drawings illustrate exemplary embodiments of the present invention and, together with the description, serve to explain principles of the present disclosure. In the figures:

FIGS. 4A through 6A are sectional views taken along a line I-I' of FIG. 1 to illustrate a method for forming a NAND type non-volatile memory device; and FIGS. 4B through 6B are sectional views taken along a line III-III' of FIG. 1 to illustrate a method for forming a NAND type non-volatile memory device.

DETAILED DESCRIPTION OF EXEMPLARY EMBODIMENTS

Figure 1:
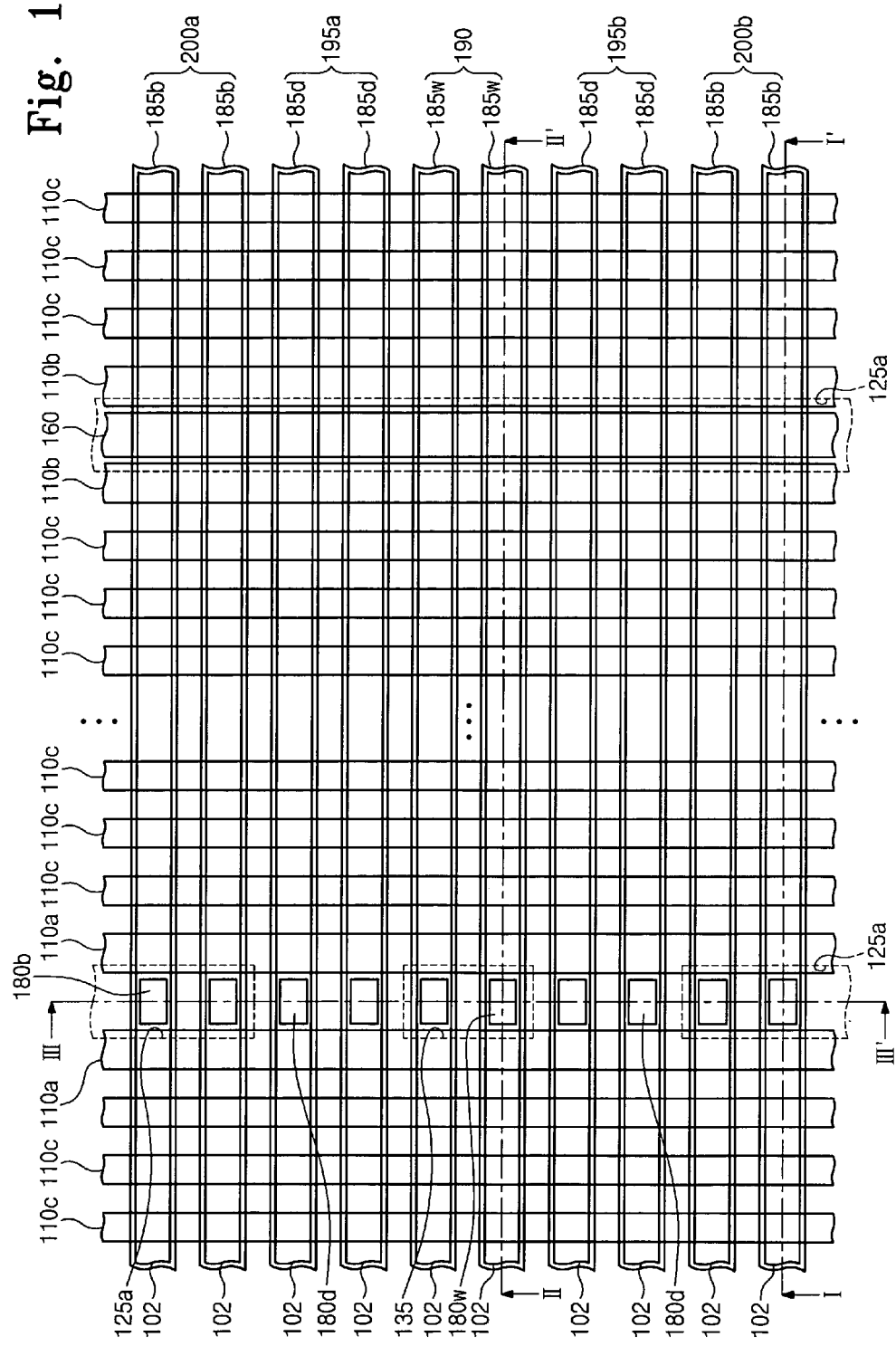
FIG. 1 is a plan view of a NAND type non-volatile memory device according to an exemplary embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present disclosure to those skilled in the art. In the figures, the dimensions of layers and regions may be exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2A:
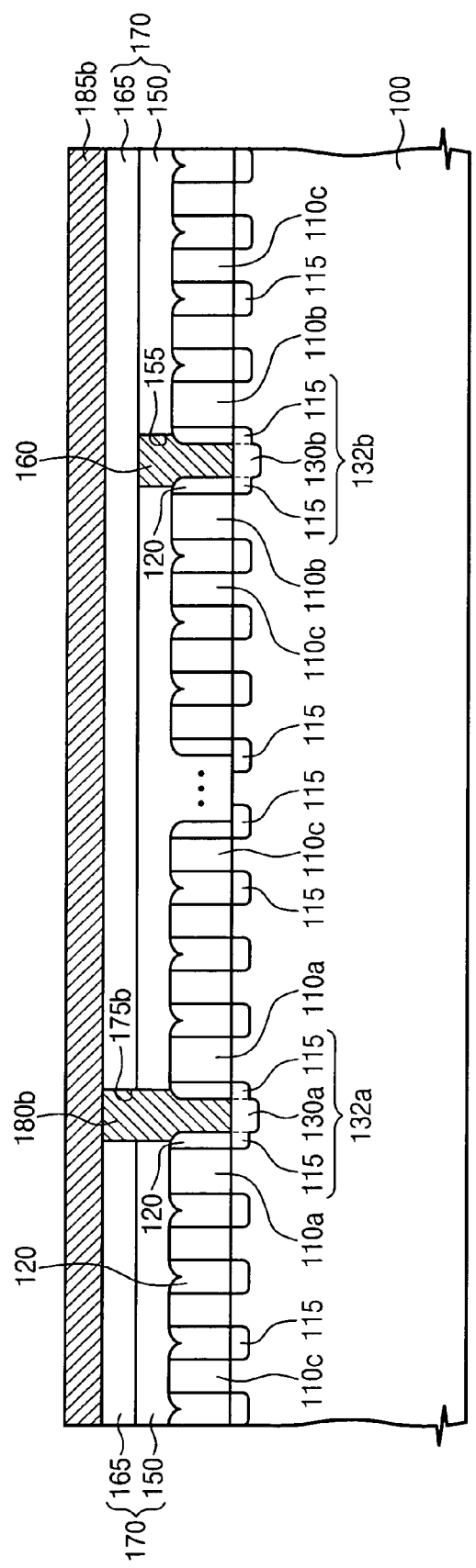
FIGS. 2A, 2B, and 2C are sectional views of the NAND type non-volatile memory device of FIG. 1 taken along lines I-I', II-II', and III-III', respectively.
Figure 2B:
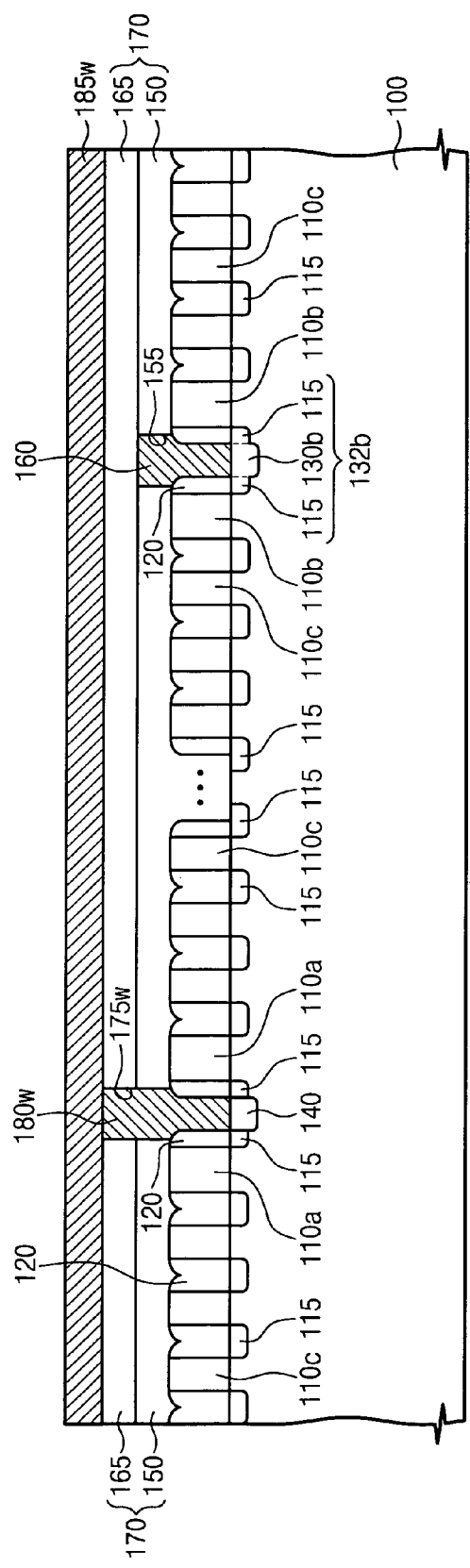
Figure 2C:
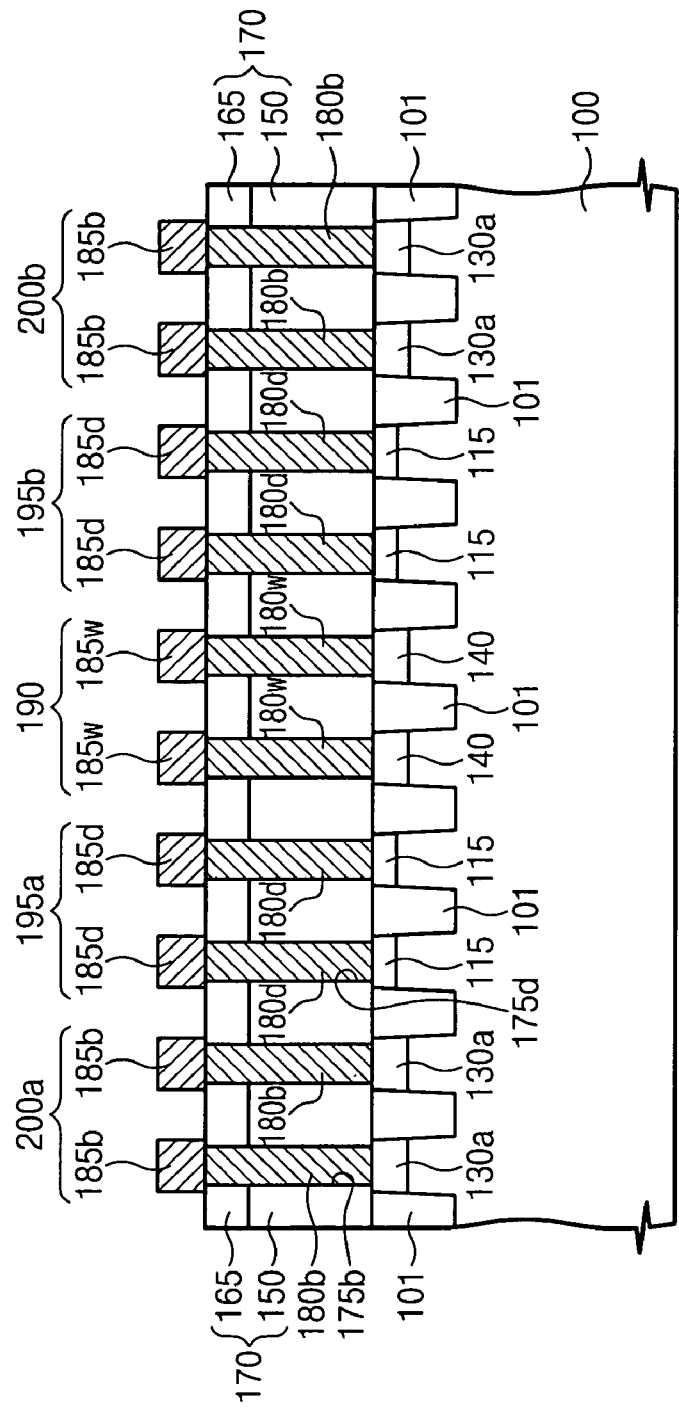
Figure 3:
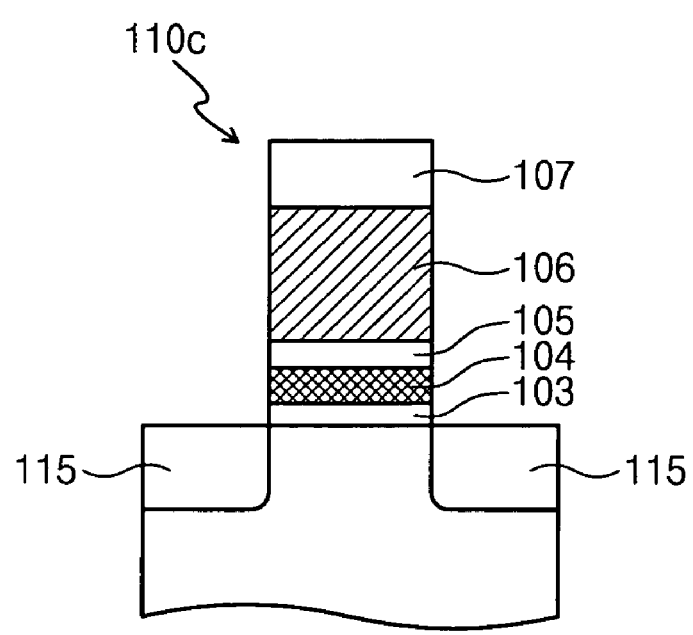
FIG. 3 is an enlarged sectional view of a cell gate line of FIG. 2A.

FIG. 1 is a plan view of a NAND type non-volatile memory device according to an embodiment of the present invention. FIGS. 2A, 2B, and 2C are sectional views of the NAND type non-volatile memory device of FIG. 1 taken along lines I-I', II-II', and III-III', respectively. FIG. 3 is an enlarged sectional view of a cell gate line of FIG. 2A.

Referring to FIGS. 1, 2A, 2B, 2C, and 3, a device isolation layer 101 defining a plurality of active regions 102 is disposed on a semiconductor substrate 100 (hereinafter, referred to as the substrate). The device isolation layer 101 may be a trench type device isolation layer. The active regions 102 extend in parallel along a first direction. The active regions 102 are formed in a line shape. The active regions 102 are disposed at regular intervals. The active regions 102 are portions of the substrate 100 surrounded by the device isolation layer 101. The active regions 102 have identical widths. A well doped with a first conductive type dopant is formed at the active region 102. Accordingly, the active regions 102 are doped with the first conductive type dopant.

A first select gate line 110a and a second select gate line 110b run parallel to each other and cross over the active regions 102. The first and second select gate lines 110a and 110b extend along a second direction perpendicular to the first direction. A plurality of cell gate lines 110c run parallel to each other and cross over the active regions 102 between the first and second select gate lines 110a and 110b. The plurality of cell gate lines 110c are parallel to the first and second select gate lines 110a and 110b. The plurality of cell gate lines 110c are disposed parallel to each other at the same regular interval.

A plurality of cell gate lines 110c between the adjacent first and second select gate lines 110a and 110b comprise a cell string gate group. The cell string gate groups are repeatedly disposed on the active regions in mirror symmetry.

A low concentration doping region 115 is disposed on an active region 102 on two sides of each of the plurality of cell gate lines 110c. The low concentration doping region 115 is doped with a second conductive type dopant. The low concentration doping region 115 is formed at the active region on two sides of each of the plurality of cell gate lines 110c corresponds to a cell doping region. Gate spacers 120 are disposed on both sidewalls of each of the plurality of cell gate line 110c and the first and second select gate lines 110a and 110b.

A more specific structure of each of the plurality of cell gate line 110c is illustrated in FIG. 3. The cell gate lines 110c include a tunnel insulation layer 103, a charge storing pattern 104, a blocking insulation pattern 105, and a control gate electrode 106. The control gate electrode 106 crosses over the active regions 102 along the second direction. The charge storing pattern 104 is interposed between the control gate electrode 106 and the active region 102s. The tunnel insulation layer 103 is interposed between the charge storing pattern 104 and the active regions 102. The blocking insulation pattern 105 is interposed between the charge storing pattern 104 and the control gate electrode 106. The tunnel insulation layer 103, and other layers, may be formed of a thermal oxide layer. The charge storing pattern 104 may be formed of doped silicon or undoped silicon. Alternatively, the charge storing pattern 104 may be formed of a trap storing layer (e.g., a nitride layer, a nitride oxide layer, and/or nano-crystal layer) having deep level traps. The blocking insulation pattern 105 may be comprised of a thicker oxide layer compared to the tunnel insulation layer 103. Alternatively, the blocking insulation pattern 105 may be formed of an oxide-nitride-oxide layer (ONO layer). Alternatively, the blocking insulation pattern 105 may include a high-k layer (e.g., an insulation metal oxide layer such as an aluminum oxide layer and a hafnium oxide layer). The control gate electrode 106 may be formed of a conductive material. For example, the control gate electrode 106 may be formed of a metal such as doped silicon, tungsten, etc., a conductive metal nitride such as titanium nitride and tantalum nitride, etc., and/or a metal silicide such as tungsten silicide and cobalt silicide, etc. The cell gate lines 110c further include a cell capping pattern 107 disposed on the control gate electrode 106. The cell capping pattern 107 may comprise a nitride layer and/or a nitride oxide layer. The first and second select gate patterns 110a and 110b include a sequentially-stacked gate insulation layer and select gate electrode.

A first insulation layer 150 covers an entire surface of the substrate 100. A source line 160 is disposed in the first insulation layer 150. The source line 160 is disposed on one side of the second select gate line 110b, and is parallel to the second select gate line 110b. The source line 160 extends along the second direction to fill a source groove 155 crossing over a second active region of the active regions 102. The source line 160 contacts the active regions 102 at one side of the second select gate line 110b. The top surface of the source line 160 is coplanar with the top surface of the first insulation layer 150. A common source region 132b is formed at a first active region of the active regions 102 contacting the source line 160. The common source region 132b is a doping region doped with a second conductive type dopant. The common source region 132b includes a low concentration doping region 115 disposed below the gate spacer 120 in the sidewall of the second select gate line 110b, and a high concentration doping region 130b contacting the source line 160. A dopant concentration of the high concentration doping region 130b is higher than that of the low concentration doping region 115. The source line 160 may include sidewalls aligned to the gate spacer 120 formed on a sidewall of the second select gate line 110b. The first insulation layer comprises an oxide layer. The source line 160 comprises a conductive material. For example, the source line 160 may be comprised of a doped silicon, a metal, a conductive metal nitride, and/or a metal silicide.

The second insulation layer 165 covers an entire surface of the substrate 100 having the top surface of the source line 160. The first and second insulation layers 150 and 165 comprise an interlayer insulation layer 170. The second insulation layer 165 may be comprised of an oxide layer.

A plurality of contact holes 175b, 175d, and 175w penetrate the interlayer insulation layer 170 to expose the active regions 102 at one side of the first select gate line 110a. A plurality of contact plug 180b, 180d, and 180w fill the plurality of contact holes 175b, 175d, and 175w, respectively. Accordingly, the plurality of contact plug 180b, 180d, and 180w may be disposed along the second direction at regular intervals. The plurality of contact plug 180b, 180d, and 180w may be comprised of a conductive doped silicon, a metal, conductive metal nitride, and/or a metal silicide.

A plurality of wiring lines 185b, 185d, and 185w are disposed on the interlayer insulation layer 170 at regular intervals. The wiring lines 185b, 185d, and 185w contact the contact plugs 180b, 180d, and 180w, respectively. The wiring lines 185b, 185d, and 185w are parallel to the active regions 102. Additionally, the wiring lines 185b, 185d, and 185w may overlap the active regions 102. The widths of wiring lines 185b, 185d, and 185w are identical to each other. The wiring lines 185b, 185d, and 185w may be comprised of a metal such as conductive tungsten, a conductive metal nitride such as titanium nitride and tantalum nitride, and/or a metal silicide.

The wiring lines 185b, 185d, and 185w include one or more adjacent well bias lines 185w, and a plurality of bit lines 185b. Additionally, the wiring lines 185b, 185d, and 185w may further include one or more adjacent dummy lines 185d.

As described above, there may be one or more well bias line 185w. Two adjacent well bias lines 185w are illustrated in this exemplary embodiment. The well bias lines 185w comprise a well bias line group 190. The bit lines 185b are divided into a first bit line group 200a and a second bit line group 200b. The first bit lint group 200a includes a plurality of adjacent bit lines 185b. Likewise, the second bit line group 200b includes a plurality of adjacent bit lines 185b. The well bias line group 190 may be disposed between the first bit line group 200a and the second bit line group 200b.

One or more dummy lines 185d are disposed between the well bias line group 190 and the first bit line group 200a. Additionally, one or more dummy lines 185d are disposed between the well bias line group 190 and the second bit line group 200b. The dummy line 185d between the well bias line group 190 and the first bit line group 200a is defined as a first dummy line 185d. The dummy line 185d between the well bias line group 190 and the second bit line group 200b is defined as a second dummy line 185d. As described above, when there are more than one first dummy lines, the first dummy lines 185d comprise a first dummy line group 195a. Additionally, when there are more than one second dummy lines, the second dummy lines 185d comprise a second dummy line group 195b.

The contact plug 180w contacting the well bias line 185w is defined as a well bias plug 180w. The contact plug 180b contacting the bit line 185b is defined as a bit line plug 180b. The contact plug 180d contacting the dummy line 185d is defined as a dummy line plug 180d. Additionally, the well bias plug 180w, the bit line plug 180b, and the dummy line plug 180d filling the respective contact holes 175w, 175b, and 175d are defined as a well bias contact hole 175w, a bit line contact hole 175b, and a dummy contact hole 175d, respectively.

A well bias doping region 140 is disposed at the active regions 102 at locations where the well bias plug 180w contacts the active regions 102. The well bias doping region 140 is doped with a first conductive dopant. For example, the well bias doping region 140 and the active regions 102 are doped with the same type dopant. Accordingly, a predetermined bias may be applied to the active regions 102 (i.e., the well) through the well bias line 185w. A dopant concentration of the well bias doping region 140 may be higher than that of the active regions 102. A low concentration doping region 115 may be disposed on both sides (i.e., below one of the gate spacers 120 in the sidewall of the first select gate line 110a) of the well bias doping region 140.

A common drain region 132a is disposed at the active regions 102 where the bit line plug 180b contacts the active regions 102. The common drain region 132a is doped with a second conductive type dopant. The common drain region 132a includes a high concentration doping region 130a contacting the bit line plug 180b and a low concentration doping region 115 on two sides of the high concentration region 130a. As described above, the high and low concentration doping regions 130a and 115 may be doped with a second conductive type dopant. For example, the common drain region 132a and the active regions 102 are doped with respectively different dopants.

The low concentration doping region 115 may be disposed at the active regions 102 contacting the dummy line plug 180d. Alternatively, a region doped with a first conductive type dopant or a region doped with a second conductive type dopant is disposed at the active regions 102 where the dummy line plug 180d contacts the active regions 102. For example, a region where the dummy line plug 180d is formed corresponds to a region for obtaining a margin between a process of forming the well bias doping region 140 and a process of forming the high concentration doping region 130a of the common drain region 132a. Therefore, a dopant identical to the dopant in the well bias doping region 140 and/or the dopant in the high concentration doping region 130a can be implanted into the active regions 102 contacting the dummy line plug 180d. The dummy line can float during writing, erasing, and sensing operations of a NAND type non-volatile memory device. Alternatively, a well bias supplied into the well bias line 185w may be applied to the dummy line 185d.

Non-volatile memory cells below the well bias line 185w and the dummy line 185d correspond to dummy cells.

The dummy line 185d may be optionally omitted. In this case, the wiring lines that would otherwise have comprised the dummy lines 185d are used as bit lines. For example, when the dummy line 185d is omitted, an interval between the bit line 185b and the nearest well bias line 185w is identical to an interval between a pair of proximate wiring lines.

According to the NAND type non-volatile memory device, the well bias line 185w has an interval and a width identical to proximate wiring lines. Moreover, the active regions 102 where the well bias line 185w contacts the active regions 102 is disposed at regular intervals with respect to other active regions 102, and has an identical width. In the NAND type non-volatile memory device having the well bias line 185w, continuity and/or repeatability of the pattern are maintained. As a result, when the well bias line 185w is formed, conventional pattern defects can be prevented.

Moreover, by forming the dummy line 185d, a sufficient margin for an ion implantation process can be obtained. The ion implantation process is performed to form a high concentration doping region 130a of the well bias doping region 140 and the common drain region 132a.

FIGS. 4A through 6A are sectional views taken along a line I-I' of FIG. 1 to illustrate a method for forming a NAND type non-volatile memory device according to an exemplary embodiment of the present invention. FIGS. 4B through 6B are sectional views taken along a line III-III' of FIG. 1 to illustrate a method for forming a NAND type non-volatile memory device according to an exemplary embodiment of the present invention.

Figure 4A:
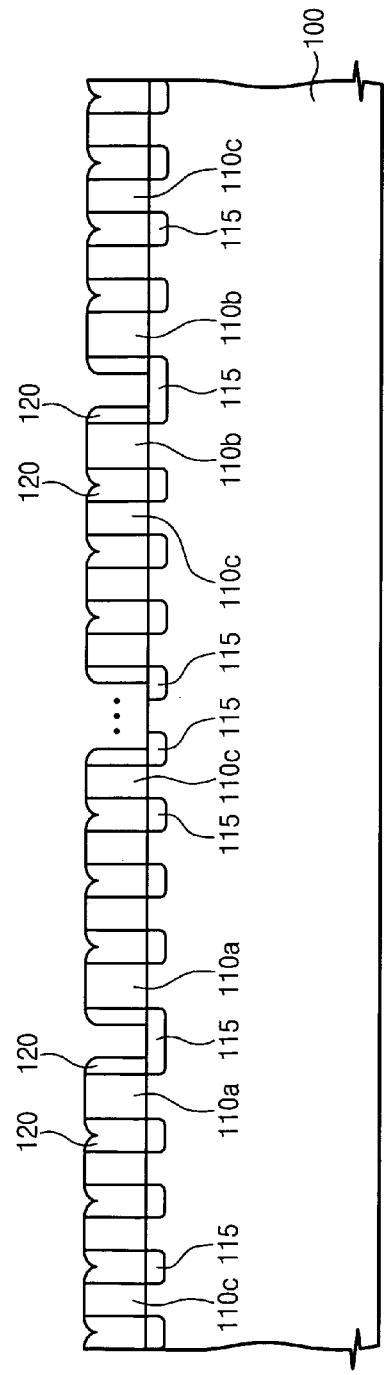
Figure 4B:
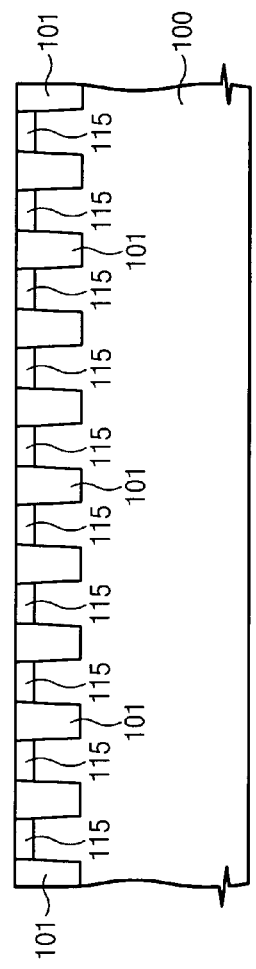

Referring to FIGS. 1, 4A, and 4B, a device isolation layer 101 is formed on a substrate 100 to define a plurality of active regions 102. The plurality of active regions 102 extend along a first direction at regular intervals. After forming the active regions 102, a well formation process implanting first conductive type dopant ions into the active regions 102 is performed. Alternatively, after performing the well formation process that implants first conductive type dopant ions, a device isolation layer 101 defining the active regions 102 at the well can be formed. Accordingly, the active regions 102 are doped with a first conductive type dopant.

A first select gate line 110a, a plurality of cell gate lines 110c, and a second select gate line 110b are formed to run parallel to each other and cross over the plurality of active regions. The gate lines 110a, 110b, and 110c are described above with reference to FIGS. 1, 2a, 2b, 2c, and 3.

A first ion implantation process is performed to implant second conductive type dopant ions by using the gate lines 110a, 110b, and 110c as a mask. Accordingly, a low concentration doping region 115 is formed at the active regions 102 on two sides of the gate lines 110a, 110b, and 110c.

Next, a gate spacers 120 are formed on both sidewalls of the gate lines 110a, 110b, and 110c.

Figure 5A:
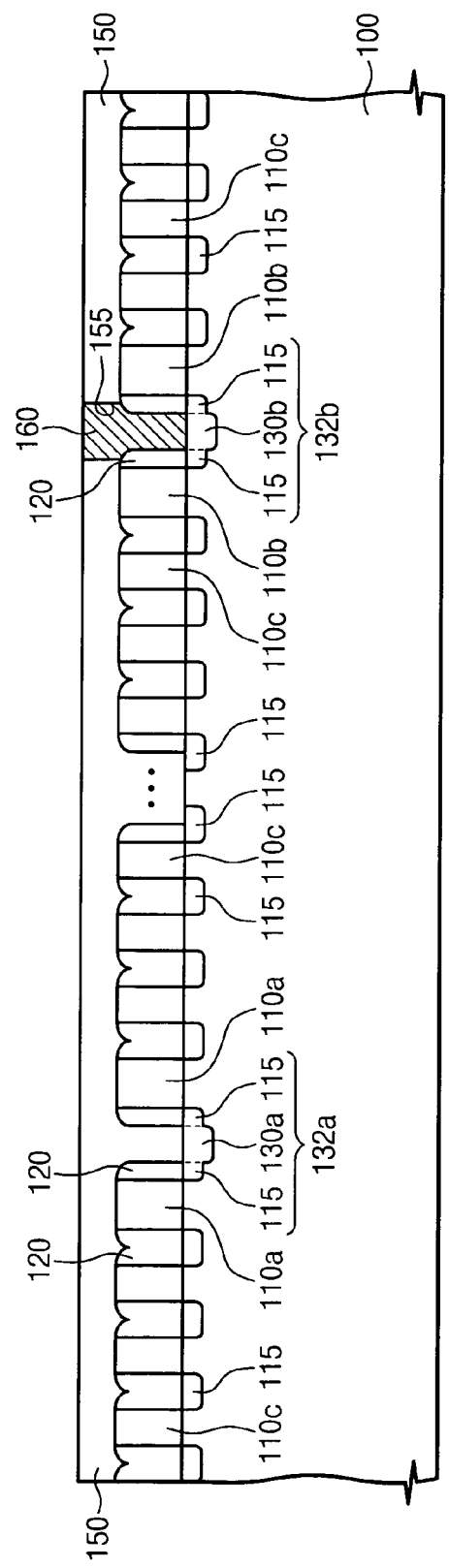
Figure 5B:
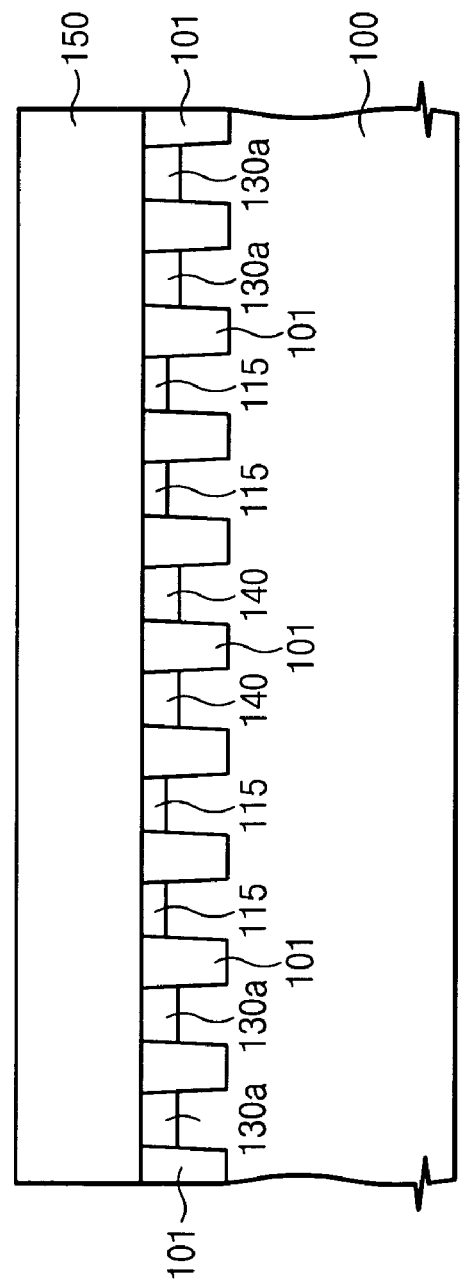

Referring to FIGS. 1, 5A, and 5B, a first mask pattern having first and second openings 125a and 125b of FIG. 1 is formed on the substrate 100. A second ion implantation process is performed to implant second conductive type dopant ions by using the first mask pattern as a mask. Accordingly, a high concentration doping region 130a of the common drain region 132a and a high concentration doping region 130b of the common source region 132b are formed. A high concentration doping region 130b of the common source region 132b is formed below a source line disposed under the well bias line 185w. A dose amount of dopant ions in the second ion implantation process may be larger than that of dopant ions in the first ion implantation process. The first mask pattern is removed.

A second mask pattern having a third opening 135 of FIG. 1 is formed on the substrate 100. A third ion implantation process is performed to implant first conductive type dopant ions by using the second mask pattern as a mask. Accordingly, a well bias doping region 140 is formed. As illustrated in FIG. 1, the third opening 135 exposes the active region 102 in a region where a well bias contact hole will be formed. The second mask pattern is removed.

A process of forming the well bias doping region 140, and a process of forming the high concentration doping regions 130a and 130b are sequentially performed. At this point, after the forming of the high concentration doping regions 130a and 130b, the well bias doping region 140 can be formed. Alternatively, after forming the well bias doping region 140, the high concentration doping regions 130a and 130b may be formed.

A region where the dummy lines 180d of FIG. 1 are formed can be used as a process margin in the first and second ion implantation processes.

Next, a first insulation layer 150 is formed on an entire surface of the substrate 100. The first insulation layer 150 and the gate spacer 120 may have respectively different etching selectivities. For example, the first insulation layer is formed of an oxide layer, and the gate spacer 120 may be formed of a nitride layer or a nitride oxide layer.

A source groove 155 is formed by patterning the first insulation layer 150. The source groove 155 crosses over the active regions 102 at one side of the second select gate line 110b. The source groove exposes the common source regions 132b. Next, a first conductive layer filling the source groove 155 is formed on an entire surface of the substrate 100, and the first conductive layer is planarized until the first insulation layer 150 is exposed to form a source line 160. The top surface of the source line 160 is made to be coplanar with the top surface of the first insulation layer 150 by performing a planarization process.

Figure 6A:
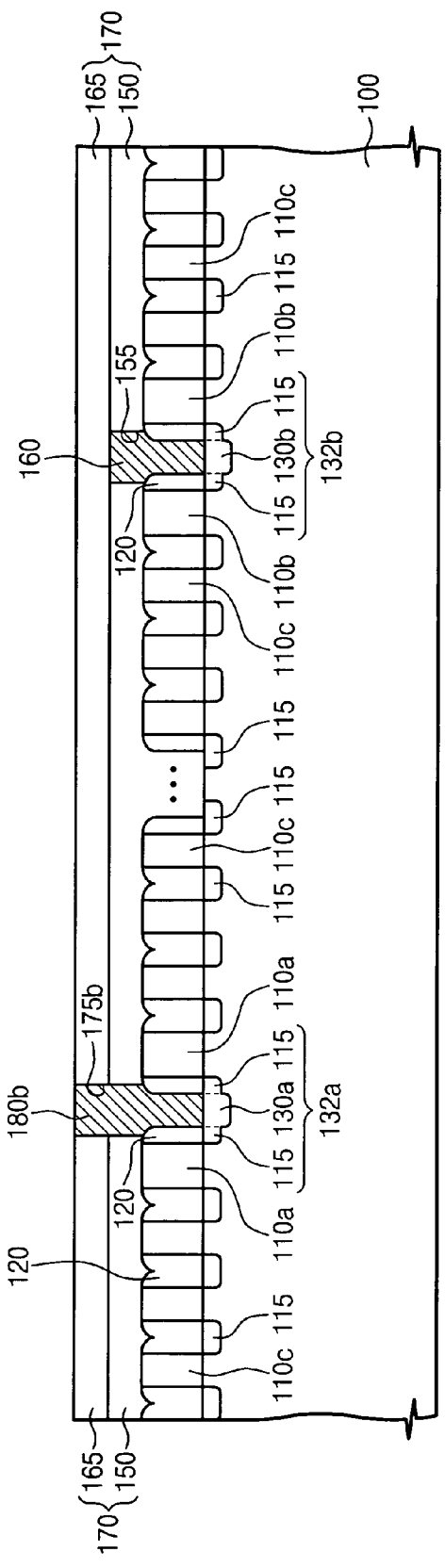

Referring to FIGS. 1, 6A, and 6B, a second insulation layer 165 is formed on an entire surface of the substrate 100. The first and second insulation layers 150 and 165 comprise an interlayer insulation layer 170. A plurality of contact holes 175b, 175d, 175w are formed to expose respective active regions 102 at one side of the first select gate line 110a by patterning the interlayer insulation layer 170. The contact holes 175b, 175d, 175w are disposed at regular intervals along a second direction perpendicular to the first direction. The contact holes 175b, 175d, 175w may be self-aligned to the gate spacer 120 formed on a side wall of the first select gate line 110a. The bit line contact hole exposes the common drain region 132a, and the well bias contact hole 175w exposes the well bias doping region 140. The dummy line contact hole 175d exposes the well bias doping region 140 and the common drain region 132a, and also the low concentration doping region 115 disposed along the second direction.

A second conductive layer is formed on an entire surface of the substrate 100 to fill the contact holes 175b, 175d, and 175w. The second conductive layer is planarized until the top surface of the interlayer insulation layer is exposed to form contact plugs 180b, 180d, and 180w. The bit line plug 180b fills the bit line contact hole 175b. The well bias plug 180w fills the well bias contact hole 175w. The dummy line plug 180d fills the dummy line contact hole 175d.

Next, the wiring lines 185b, 185d, and 185w illustrated in FIGS. 1, 2A, 2B, and 2C are formed on the interlayer insulation layer 170, thereby embodying the NAND type non-volatile memory device illustrated in FIGS. 1, 2A, 2B, and 2C.

As described above, the well bias line has an interval identical to that of neighboring wiring lines. Moreover, the active region where the well bias line makes electrical contact is arranged at regular intervals as neighboring active regions. Accordingly, the well bias line and the active region are formed, where the well bias line contacts maintain continuity and/or repeatability of patterns in the NAND type non-volatile memory device. Consequently, conventional pattern defects can be prevented.

The above-disclosed subject matter is to be considered illustrative, and not restrictive, and the appended claims are intended to cover all such modifications, enhancements, and other embodiments, which fall within the true spirit and scope of the present invention.

What is claimed is:

1. A NAND type non-volatile memory device comprising:
    a plurality of active regions arranged at equal intervals on a substrate, extending along a first direction, and doped with a first conductive type dopant;
    first and second select gate lines, running substantially parallel to each other, crossing over the plurality of active regions;
    a plurality of cell gate lines crossing over the plurality of active regions between the first and second select gate lines;
    a cell doping region formed at each of the plurality of active regions on two sides of each of the plurality of cell gate lines, and doped with a second conductive type dopant;
    a plurality of contact plugs penetrating an interlayer insulation layer covering the substrate to contact the plurality of active regions respectively at one side of the first select gate line, and arranged at the equal intervals along a second direction perpendicular to the first direction; and
    a plurality of wiring lines arranged at the equal intervals on the interlayer insulation layer, substantially parallel to the plurality of active regions, and connected to the plurality of contact plugs respectively, the wiring lines including bit lines, and one or more well bias lines adjacent thereto.

2. The device of claim 1, wherein the bit lines are divided into a first bit line group and a second bit line group, and the well bias lines are disposed between the first bit line group and the second bit line group.

3. The device of claim 2, wherein one or more of the plurality of wiring lines between the well bias line and the first bit line group are first dummy lines, and one or more wiring lines between the well bias line and the second bit line group are second dummy lines.

4. The device of claim 3, wherein during writing, erasing, and sensing operations, the first and second dummy lines are floated, or a voltage identical to a voltage supplied to the well bias line is applied to the first and second dummy lines.

5. The device of claim 2, wherein an interval between each of the bit line and a nearest well bias line of the well bias lines is identical to an interval between proximate wiring lines of the plurality of wiring lines.

6. The device of claim 1, further comprising:
    a well bias doping region formed at the plurality of active regions contacting the plurality of contact plugs connected to the well bias lines, and doped with the first conductive type dopant; and
    a common drain region formed at the plurality of active regions contacting the contact plugs connected to the bit lines, and doped with the second conductive type dopant.

7. The device of claim 6, wherein the well bias doping region has a dopant concentration higher than that of the plurality of active regions.

8. The device of claim 6, further comprising a gate spacer formed on two sidewalls of the first select gate line, and the well bias doping region and the common drain region are aligned with the gate spacer.

9. The device of claim 1, further comprising a source line disposed in the interlayer insulation layer, and crossing over the plurality of active regions at one side of the second select gate line along the second direction, the source line contacting the plurality of active regions therebelow.

10. The device of claim 9, wherein the interlayer insulation layer comprises sequentially stacked first and second insulation layers, the top surface of the source line being coplanar with the top surface of the first insulation layer, and the second insulation layer covering the source line.

11. The device of claim 1, wherein the plurality of cell gate lines comprises:
    a control gate electrode crossing over the plurality of active regions;
    a charge storing pattern interposed between the control gate electrode and the plurality of active regions;
    a tunnel insulation layer interposed between the charge storing pattern and the plurality of active regions; and
    a blocking insulation pattern interposed between the charge storing pattern and the control gate electrode.

12. A method for forming a NAND type non-volatile memory device, the method comprising:
    forming a plurality of active regions arranged at equal intervals on a substrate, extending along a first direction, and doped with a first conductive type dopant;
    forming first and second select gate lines, running substantially parallel to each other, crossing over the plurality of active regions, and a plurality of cell gate lines crossing over the plurality of active regions between the first and second select gate lines;
    performing a cell ion implantation process with a second conductive type dopant using the plurality of cell gate lines and the first and second select gate lines as a mask;
    forming an interlayer insulation layer covering the substrate;
    forming a plurality of contact plugs penetrating the interlayer insulation layer to contact the plurality of active regions respectively at one side of the first select gate line, and arranged at the equal intervals along a second direction perpendicular to the first direction; and forming a plurality of wiring lines arranged at the equal intervals on the interlayer insulation layer, substantially parallel to the plurality of active regions, and connected to the plurality of contact plugs respectively, the plurality of wiring lines including bit lines, and one or more well bias lines adjacent thereto.

13. The method of claim 12, wherein the bit lines are divided into a first bit line group and a second bit line group, and the well bias lines are disposed between the first bit line groups and the second bit line group.

14. The method of claim 13, wherein one or more of the plurality of wiring lines between the well bias line and the first bit line group are first dummy lines, and one or more wiring lines between the well bias line and the second bit line group are second dummy lines.

15. The method of claim 13, wherein an interval between each of the bit line and a nearest well bias line of the well bias lines is identical to an interval between proximate wiring lines of the plurality of wiring lines.

16. The method of claim 12, further comprising, before the forming of the interlayer insulation layer, forming a well bias doping region formed at the plurality of active regions contacting the plurality of contact plugs connected to the well bias lines, the well bias doping region being doped with the first conductive type dopant.

17. The method of claim 16, wherein the well bias doping region has a dopant concentration higher than that of the plurality of active regions.

18. The method of claim 16, further comprising, before the forming of the well bias doping region, forming gate spacers on two sidewalls of the first and second select gate lines.

19. The method of claim 12, further comprising, before the forming of the interlayer insulation layer, implanting the second conductive type dopant ions at the active regions contacting the plurality of contact plugs connected to the bit lines.

20. The method of claim 12, wherein the interlayer insulation layer comprises sequentially stacked first and second insulation layers, and further comprising forming a source line disposed in the first insulation layer and crossing over the active regions at one side of the second select gate line along the second direction, the source line contacting the active regions below the source line, the top surface of the source line being coplanar with the top surface of the first insulation layer, and the second insulation layer covering the top surface of the source line.

* * * * *